United States Patent
Kang et al.

(10) Patent No.: US 11,460,963 B2
(45) Date of Patent: Oct. 4, 2022

(54) DISPLAY DEVICE

(71) Applicant: Samsung Display Co., Ltd., Yongin-si (KR)

(72) Inventors: Bongil Kang, Namyangju-si (KR); Jun-Young Ko, Seoul (KR); Gayeon Yun, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/193,675

(22) Filed: Mar. 5, 2021

(65) Prior Publication Data
US 2022/0206631 A1 Jun. 30, 2022

(30) Foreign Application Priority Data
Dec. 24, 2020 (KR) .................. 10-2020-0183056

(51) Int. Cl.
G06F 3/044 (2006.01)

(52) U.S. Cl.
CPC .. *G06F 3/0443* (2019.05); *G06F 2203/04107* (2013.01)

(58) Field of Classification Search
None
See application file for complete search history.

(56) References Cited

U.S. PATENT DOCUMENTS

| 9,490,307 B2 | 11/2016 | Kim |
| 2016/0092022 A1 | 3/2016 | Lee et al. |
| 2017/0025444 A1* | 1/2017 | Hirakata .............. H01L 27/1262 |
| 2017/0205925 A1* | 7/2017 | Yamazaki ........... G02F 1/13624 |
| 2017/0315644 A1* | 11/2017 | Hayakawa ............... H01Q 1/48 |
| 2018/0031943 A1* | 2/2018 | Yamazaki ............. G02F 1/1677 |
| 2021/0311606 A1* | 10/2021 | Kono ...................... G02F 1/133 |

FOREIGN PATENT DOCUMENTS

| KR | 10-2016-0036927 A | 4/2016 |
| KR | 10-2019-0121469 A | 10/2019 |
| KR | 10-2103500 B1 | 4/2020 |

OTHER PUBLICATIONS

Samsung Electronics Co., Ltd., "Samsung Electronics, 'Galaxy S20' released to the whole world at last," Mar. 6, 2020, https://news.samsung.com/kr/ 삼성전자-갤럭시-s20-전-세계- -본격-출시 (with English translation), 12 pages.

* cited by examiner

*Primary Examiner* — Duane N Taylor, Jr.
(74) *Attorney, Agent, or Firm* — Lewis Roca Rothgerber Christie LLP

(57) ABSTRACT

A display device includes a display module including a display panel and an input sensing layer on the display panel, and a flexible circuit film connected to the display module. The flexible circuit film includes a base film, a sensor connection wire, a ground wire, an insulating layer, a first conductive layer, and a cover tape. The sensor connection wire is on the base film and is electrically connected to the input sensing layer. The ground wire is on the base film, and the insulating layer covers the sensor connection wire. The first conductive layer is on the insulating layer and is electrically connected to the ground wire, and the cover tape is on the first conductive layer and is electrically connected to the ground wire.

20 Claims, 13 Drawing Sheets

DISPLAY DEVICE

CROSS-REFERENCE TO RELATED APPLICATION

This application claims priority to and the benefit of Korean Patent Application No. 10-2020-0183056, filed on Dec. 24, 2020 in the Korean Intellectual Property Office, the entire disclosure of which is incorporated by reference herein.

STATEMENT REGARDING PRIOR DISCLOSURES BY THE INVENTOR OR A JOINT INVENTOR UNDER 37 CFR 1.77(b)(6)

A device (i.e., Samsung Galaxy S20) that contains a display device manufactured by Samsung Display Co., Ltd. (Samsung Display) incorporating one or more embodiments of the present disclosure was released on Mar. 6, 2020 by Samsung Electronics Co., Ltd. (Samsung Electronics) as shown on Samsung website, https://news.samsung.com/kr/삼성전자-갤럭시-s20-전-세계-본격-출시. . Samsung Display obtained the embodiments of the present disclosure from the present inventors, BONGIL KANG, JUN-YOUNG KO, and GAYEON YUN who, during the course of their employment, developed the embodiments of the present disclosure incorporated into the display device that Samsung Electronics obtained from Samsung Display and incorporated into the device released on Mar. 6, 2020. A copy of the printout of the Samsung website specifying the release date of Mar. 6, 2020, together with an English translation, is provided with a concurrently filed Information Disclosure Statement pursuant to the guidance of 78 Fed. Reg. 11076 (Feb. 14, 2013).

BACKGROUND

1. Field

Aspects of embodiments of the present disclosure relate to a display device.

2. Description of the Related Art

Multimedia electronic devices, such as a television, a mobile phone, a tablet computer, a navigation device, a game machine, and the like, include a display device for displaying images. The electronic devices may include an input sensor capable of providing a touch-based input method that enables a user to intuitively and conveniently input information or instructions, in addition to conventional input methods, such as a button, a keyboard, a mouse, and the like.

The input sensor may sense a touch or pressure using a part of the user's body.

SUMMARY

According to an aspect of embodiments of the present disclosure, a display device having improved sensing reliability is provided.

According to one or more embodiments, a display device includes a display module including a display panel and an input sensing layer on the display panel, and a flexible circuit film connected to the display module, and the flexible circuit film includes a base film, a sensor connection wire, a ground wire, an insulating layer, a first conductive layer, and a cover tape. The sensor connection wire is on the base film and is electrically connected to the input sensing layer. The ground wire is on the base film, and the insulating layer covers the sensor connection wire. The first conductive layer is on the insulating layer and is electrically connected to the ground wire, and the cover tape is on the first conductive layer and is electrically connected to the ground wire.

According to one or more embodiments, a display device includes a display module including a display panel and an input sensing layer on the display panel, and a flexible circuit film connected to the display module, and the flexible circuit film includes a base film, a sensor connection wire, a ground wire, an insulating layer, a first conductive layer, and a cover tape. The sensor connection wire is on the base film and is connected to the input sensing layer. The ground wire is on the base film, and the insulating layer covers the sensor connection wire. The first conductive layer is on the insulating layer and is coupled to the ground wire with a first adhesive strength, and the cover tape is on the first conductive layer and is coupled to the ground wire with a second adhesive strength different from the first adhesive strength.

BRIEF DESCRIPTION OF THE FIGURES

The above and other objects and features of the present disclosure will become apparent by describing in further detail some embodiments thereof with reference to the accompanying drawings.

DETAILED DESCRIPTION

Figure 1A:
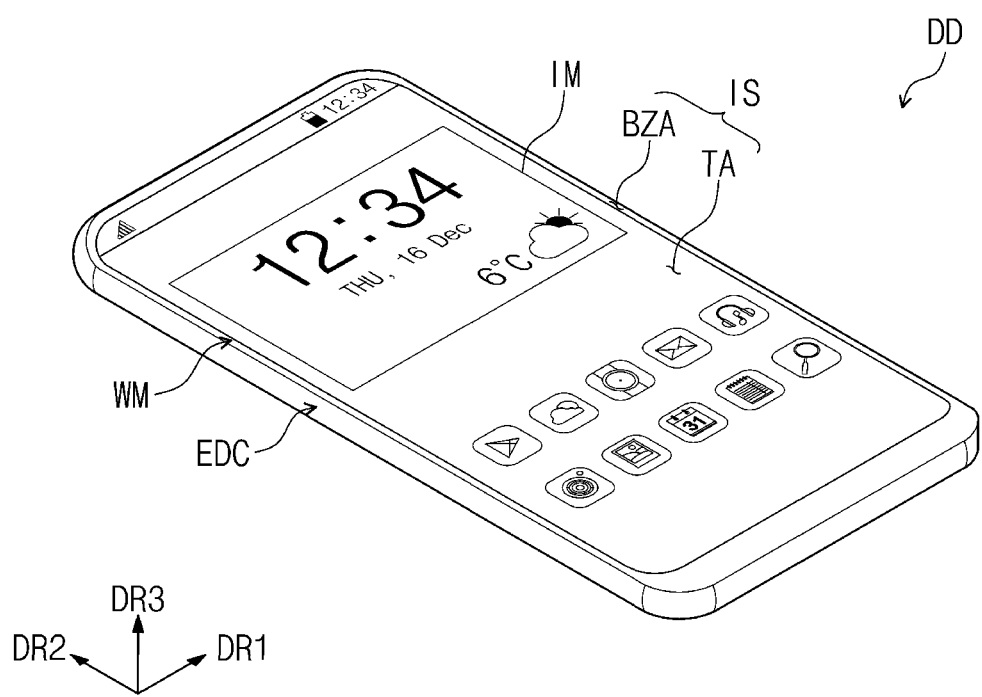
FIG. 1A is a perspective view of a display device according to an embodiment of the present disclosure.

The present invention will be described more fully herein with reference to the accompanying drawings, in which some embodiments are shown. The present invention may, however, be embodied in many different forms, and should not be construed as limited to the embodiments set forth herein.

In this specification, when a component (or an area, a layer, a part, etc.) is referred to as being "on," "connected to," or "coupled to" another component, this means that the component may be directly on, connected to, or coupled to the other component, or one or more third components may be present therebetween.

Same reference numerals refer to same components. Additionally, in the drawings, the thicknesses, proportions, and dimensions of components may be exaggerated for effective description.

As used herein, the term "and/or" includes all of one or more combinations defined by related components.

Terms such as "first," "second," and the like may be used to describe various components, but the components should not be limited by the terms. The terms may be used for distinguishing one component from other components. For example, without departing the scope of the present disclosure, a first component may be referred to as a second component, and, similarly, the second component may also be referred to as the first component. The terms of a singular form may include plural forms unless otherwise specified.

In addition, terms such as "below," "under," "above," and "over" are used to describe a relationship of components illustrated in the drawings. The terms are relative concepts and are described based on directions illustrated in the drawing.

It is to be understood that terms such as "comprise," "include," and "have," when used herein, specify the presence of stated features, numbers, steps, operations, components, parts, or combinations thereof, but do not preclude the presence or addition of one or more other features, numbers, steps, operations, components, parts, or combinations thereof.

Unless otherwise defined, all terms including technical and scientific terms used herein have the same meaning as commonly understood by one of ordinary skill in the art to which this disclosure belongs. It is to be further understood that terms, such as those defined in commonly used dictionaries, should be interpreted as having a meaning that is consistent with their meaning in the context of the relevant art and are not to be interpreted in an idealized or overly formal sense unless expressly so defined herein.

Herein, some embodiments of the present disclosure will be described with reference to the accompanying drawings.

Figure 1B:
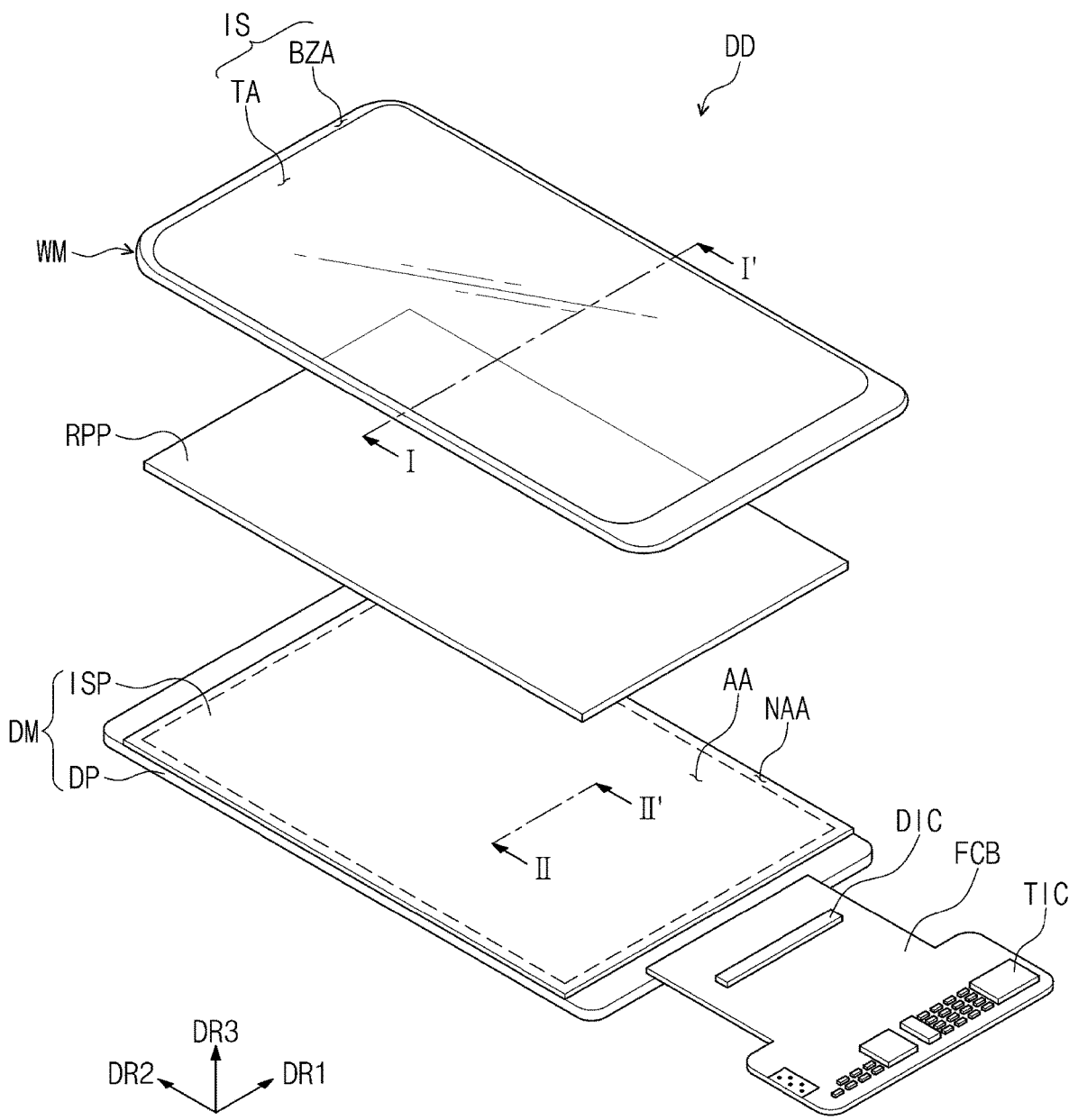
FIG. 1B is an exploded perspective view of the display device of FIG. 1A.

FIG. 1A is a perspective view of a display device according to an embodiment of the present disclosure; FIG. 1B is an exploded perspective view of the display device of FIG. 1A; and FIG. 1C is a cross-sectional view taken along the line I-I' in FIG. 1B.

Figure 1C:
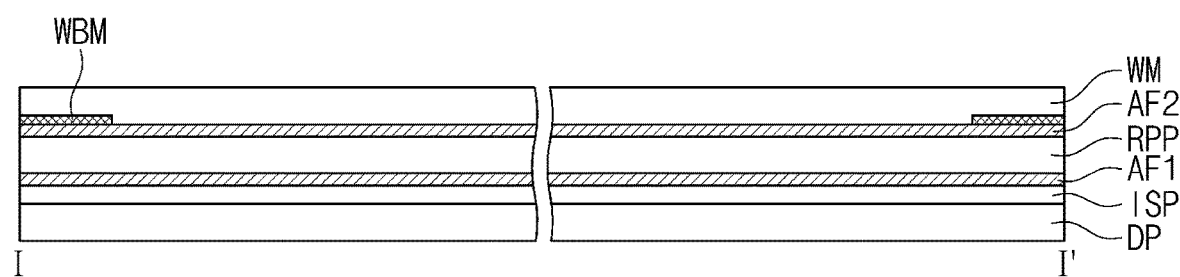
FIG. 1C is a cross-sectional view taken along the line I-I' in FIG. 1B.
Figure 1C:
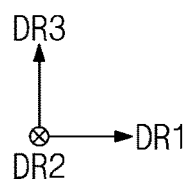

Referring to FIGS. 1A, 1B, and 1C, a display device DD may be activated in response to an electrical signal. The display device DD may include any of various embodiments. For example, the display device DD may be applied to electronic devices, such as a smart watch, a tablet computer, a notebook computer, a computer, a smart television, and the like.

The display device DD may display an image IM in a third direction DR3 on a display surface IS parallel to a first direction DR1 and a second direction DR2. The display surface IS on which the image IM is displayed may correspond to a front surface of the display device DD. The image IM may include a still image as well as a dynamic image.

In an embodiment, front surfaces (or upper surfaces) and rear surfaces (or lower surfaces) of members are defined with respect to the third direction DR3 in which the image IM is displayed. The front surfaces and the rear surfaces may be opposite to each other in the third direction DR3, and the normal directions of the front surfaces and the rear surfaces may be parallel to the third direction DR3.

The separation distance between the front surface and the rear surface of the display device DD in the third direction DR3 may correspond to a thickness of the display device DD in the third direction DR3. However, the directions indicated by the first, second, and third directions DR1, DR2, and DR3 may be relative concepts and may be converted to different directions.

The display device DD may sense an external input applied from the outside. The external input may include various forms of inputs provided from outside the display device DD. For example, the external input may include not only a touch of a part of a user's body (e.g., a finger of the user) on the display device DD, but also an external input (e.g., a hovering input) applied by an input tool or a part of the user's body that is proximate to, or spaced a distance (e.g., a predetermined distance) apart from, the display device DD. Further, the external input may have any of various forms, such as force, pressure, temperature, light, and the like.

The front surface of the display device DD may be divided into a light-transmitting area TA and a bezel area BZA. The light-transmitting area TA may be an area where the image IM is displayed. The user views the image IM through the light-transmitting area TA. In an embodiment, the light-transmitting area TA may have a quadrilateral shape having rounded corners. However, this is illustrative, and the light-transmitting area TA may have any of various shapes and is not limited to any one embodiment.

The bezel area BZA is adjacent to the light-transmitting area TA. The bezel area BZA may have a color (e.g., a predetermined color). In an embodiment, the bezel area BZA may surround the light-transmitting area TA. Accordingly, the shape of the light-transmitting area TA may be substantially defined by the bezel area BZA. However, this is illustrative, and, in an embodiment, the bezel area BZA may be disposed adjacent to only one side of the light-transmitting area TA, or may be omitted. The display device DD according to the present disclosure may include various embodiments and is not limited to any one embodiment.

As illustrated in FIGS. 1B and 1C, the display device DD may include a window WM, a display module DM, and an anti-reflection film RPP. The display module DM may include a display panel DP and an input sensing layer ISP.

The window WM may be formed of a transparent material through which an image is able to be output. For example, the window WM may be formed of glass, sapphire, plastic, or the like. Although the window WM is illustrated as a single layer, the window WM is not limited thereto and may include a plurality of layers. In an embodiment, although not illustrated, the above-described bezel area BZA of the display device DD may be formed by printing a material having a color (e.g., a predetermined color) on an area of the window WM. In an embodiment of the present disclosure, the window WM may include a light-blocking pattern WBM defining the bezel area BZA. In an embodiment, the light-blocking pattern WBM may be a colored organic film and may be formed by, for example, a coating method.

The display panel DP according to an embodiment of the present disclosure may be, but is not limited to, an emissive display panel. For example, the display panel DP may be an organic light emitting display panel, an inorganic light emitting display panel, or a quantum dot light emitting display panel. An emissive layer of the organic light emitting display panel may contain an organic light emitting material, and an emissive layer of the inorganic light emitting display panel may contain an inorganic light emitting material. An emissive layer of the quantum dot light emitting display panel may contain quantum dots, quantum rods, and the like. Herein, the display panel DP will be described as an organic light emitting display panel.

In an embodiment, the input sensing layer ISP may be directly disposed on the display panel DP. According to an embodiment of the present disclosure, the input sensing layer ISP may be formed on the display panel DP by a continuous process. That is, when the input sensing layer ISP is directly disposed on the display panel DP, an adhesive film is not disposed between the input sensing layer ISP and the display panel DP.

The display panel DP generates an image, and the input sensing layer ISP obtains coordinate information of an external input (e.g., a touch event).

The anti-reflection film RPP decreases the reflectivity of external light incident from above the window WM. The anti-reflection film RPP according to an embodiment of the present disclosure may include a phase retarder and a polarizer. The phase retarder may be of a film type or a liquid-crystal coated type and may include a $\lambda/2$ retarder and/or a $\lambda/4$ retarder. The polarizer may also be of a film type or a liquid-crystal coated type. The film type polarizer may include a stretched synthetic resin film, and the liquid-crystal coated type polarizer may include liquid crystals arranged in a predetermined arrangement. In an embodiment, the phase retarder and the polarizer may be implemented with one polarizer film. In an embodiment, the anti-reflection film RPP may further include a protective film disposed on the top or bottom of the polarizer film.

The anti-reflection film RPP may be disposed on the input sensing layer ISP. That is, the anti-reflection film RPP may be disposed between the input sensing layer ISP and the window WM. The input sensing layer ISP, the anti-reflection film RPP, and the window WM may be coupled together through adhesive films. A first adhesive film AF1 is disposed between the input sensing layer ISP and the anti-reflection film RPP, and a second adhesive film AF2 is disposed between the anti-reflection film RPP and the window WM. Accordingly, the anti-reflection film RPP is coupled to the input sensing layer ISP by the first adhesive film AF1, and the window WM is coupled to the anti-reflection film RPP by the second adhesive film AF2.

In an embodiment of the present disclosure, the first and second adhesive films AF1 and AF2 may include an optically clear adhesive (OCA) film. However, without being limited thereto, the first and second adhesive films AF1 and AF2 may include a general adhesive or sticky substance. For example, the first and second adhesive films AF1 and AF2 may include an optically clear resin (OCR) or a pressure sensitive adhesive (PSA) film.

In addition to the anti-reflection film RPP, a functional layer for performing a different function, for example, a protective layer may be additionally disposed between the display module DM and the window WM.

The display module DM may display an image in response to an electrical signal and may transmit/receive information about an external input. The display module DM may have an active area AA and a peripheral area NAA. The active area AA may be defined as an area that outputs an image provided by the display module DM.

The peripheral area NAA is adjacent to the active area AA. For example, the peripheral area NAA may surround the active area AA. However, this is illustrative, and the peripheral area NAA may be defined in various shapes and is not limited to any one embodiment. According to an embodiment, the active area AA of the display module DM may correspond to at least part of the light-transmitting area TA.

The display module DM may further include a flexible circuit film FCB and a panel driver DIC. The flexible circuit film FCB may be electrically connected with the display panel DP. The flexible circuit film FCB may be coupled to the peripheral area NAA of the display panel DP through a bonding process. The panel driver DIC may be a panel driving chip mounted on the flexible circuit film FCB and electrically connected with the display panel DP. The panel driving chip DIC may include drive elements (e.g., a data drive circuit) for driving pixels of the display panel DP. A structure in which the panel driving chip DIC is mounted on the flexible circuit film FCB is illustrated in FIG. 1B. However, the present disclosure is not limited thereto. For example, the panel driving chip DIC may be mounted on the peripheral area NAA of the display panel DP.

The display module DM may further include a sensor controller TIC for driving the input sensing layer ISP. The sensor controller TIC may be a sensor driving chip mounted on the flexible circuit film FCB and electrically connected with the input sensing layer ISP. The display module DM may further include a plurality of drive elements mounted on the flexible circuit film FCB. The plurality of drive elements may include a circuit unit for converting a signal input from the outside into a signal required for the panel driving chip DIC and the sensor driving chip TIC or converting a signal required for driving the display panel DP. In an embodiment, the flexible circuit film FCB may be bent so as to be disposed on a rear surface of the display module DM.

The display device DD may include an external case EDC. The external case EDC may accommodate the display module DM. The external case EDC may be coupled to the window WM and may define an exterior of the display device DD. The external case EDC may absorb impacts applied thereto from outside of the display device DD and may prevent foreign substances/moisture from entering the display module DM to protect components accommodated in the external case EDC. In an embodiment, the external case EDC may be an assembly of a plurality of separately provided accommodating members.

Figure 2:
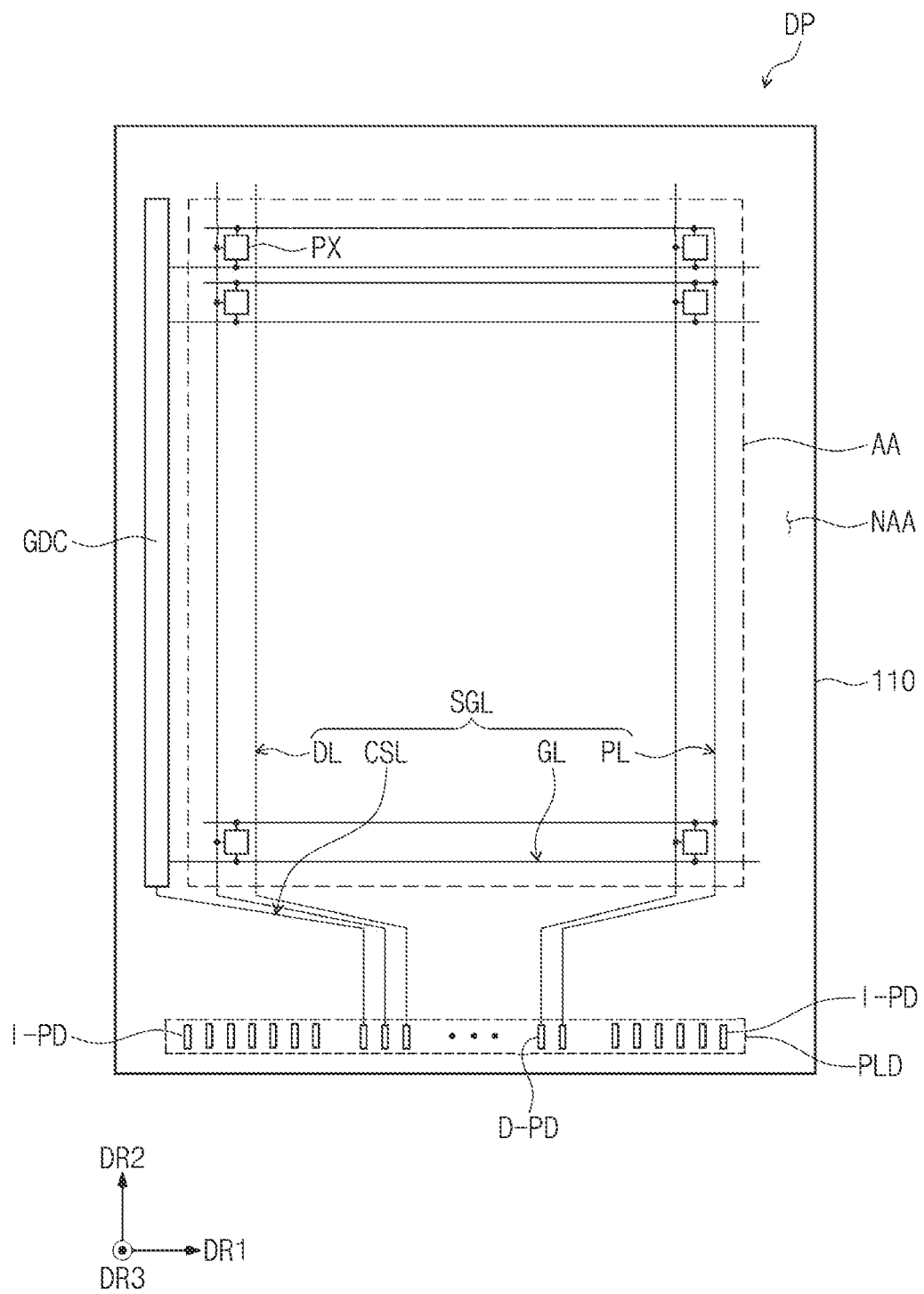
FIG. 2 is a plan view of a display panel according to an embodiment of the present disclosure.
Figure 3:
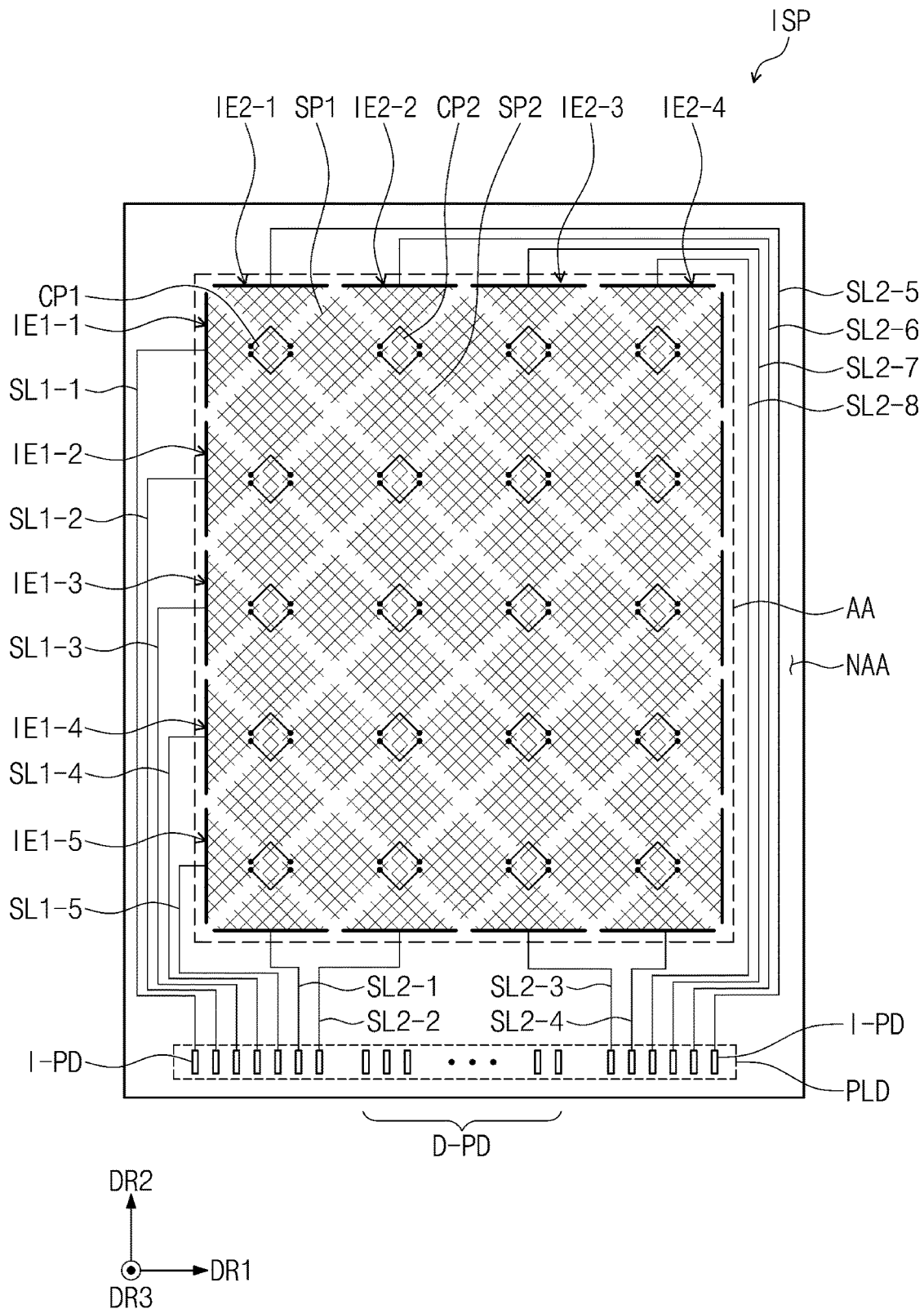
FIG. 3 is a plan view of an input sensing layer according to an embodiment of the present disclosure.

FIG. 2 is a plan view of the display panel DP according to an embodiment of the present disclosure; and FIG. 3 is a plan view of the input sensing layer ISP according to an embodiment of the present disclosure.

Referring to FIGS. 2 and 3, the display panel DP may include a base layer 110, a drive circuit GDC, a plurality of signal lines SGL, and a plurality of pixels PX. The drive circuit GDC, the plurality of signal lines SGL, and the plurality of pixels PX are disposed on the base layer 110. The display panel DP may further include a pad PLD disposed in the peripheral area NAA. The pad PLD includes pixel pads D-PD connected with corresponding ones of the plurality of signal lines SGL.

The pixels PX are disposed in the active area AA. Each of the pixels PX includes a light emitting element 114 (refer to FIG. 10) and a pixel drive circuit connected thereto. The light emitting element 114 may include an organic light emitting diode. The drive circuit GDC, the signal lines SGL, the pad PLD, and the pixel drive circuit may be included in a circuit element layer 120 illustrated in FIG. 10.

The drive circuit GDC may include a gate drive circuit. The gate drive circuit generates a plurality of gate signals (herein, referred to as the gate signals) and sequentially outputs the gate signals to a plurality of gate lines GL (herein, referred to as the gate lines) that will be described below. The gate drive circuit may additionally output another control signal to the pixel drive circuit.

The signal lines SGL include the gate lines GL, data lines DL, a power line PL, and a control signal line CSL. One of the gate lines GL is connected to a corresponding one of the pixels PX, and one of the data lines DL is connected to a corresponding one of the pixels PX. The power line PL is connected to the pixels PX. The control signal line CSL may supply control signals to the gate drive circuit. The signal lines SGL overlap the active area AA and the peripheral area NAA.

The pad PLD, to which the flexible circuit film FCB (illustrated in FIG. 1B) is connected, may include the pixel pads D-PD for electrically connecting the flexible circuit film FCB to the display panel DP and input pads I-PD for electrically connecting the flexible circuit film FCB to the input sensing layer ISP. The pixel pads D-PD and the input pads I-PD may be provided by exposing a part of interconnection wires disposed in the circuit element layer 120 from an insulating layer included in the circuit element layer 120.

The pixel pads D-PD are connected to the corresponding pixels PX through the signal lines SGL. Further, the drive circuit GDC may be connected to one of the pixel pads D-PD.

Referring to FIG. 3, the input sensing layer ISP according to an embodiment of the present disclosure may include first sensing electrodes 1E1-1 to 1E1-5, first signal lines SL1-1 to SL1-5 connected to the first sensing electrodes 1E1-1 to 1E1-5, second sensing electrodes 1E2-1 to 1E2-4, and second signal lines SL2-1 to SL2-4 connected to the second sensing electrodes 1E2-1 to 1E2-4. In an embodiment of the present disclosure, the input sensing layer ISP may include third signal lines SL2-5 to SL2-8 connected to the second sensing electrodes 1E2-1 to 1E2-4. In this case, each of the second signal lines SL2-1 to SL2-4 may be connected to one end of a corresponding one of the second sensing electrodes 1E2-1 to 1E2-4, and each of the third signal lines SL2-5 to SL2-8 may be connected to an opposite end of a corresponding one of the second sensing electrodes 1E2-1 to 1E2-4.

The first sensing electrodes 1E1-1 to 1E1-5 and the second sensing electrodes 1E2-1 to 1E2-4 cross each other. The first sensing electrodes 1E1-1 to 1E1-5 and the second sensing electrodes 1E2-1 to 1E2-4 are insulated from each other to form a mutual capacitance. The first sensing electrodes 1E1-1 to 1E1-5 are arranged in the second direction DR2 and extend in the first direction DR1. The second sensing electrodes 1E2-1 to 1E2-4 are arranged in the first direction DR1 and extend in the second direction DR2.

Each of the first sensing electrodes 1E1-1 to 1E1-5 includes first sensor parts SP1 and first connecting parts CP1 disposed in the active area AA. Each of the second sensing electrodes 1E2-1 to 1E2-4 includes second sensor parts SP2 and second connecting parts CP2 disposed in the active area AA. In an embodiment, two first sensor parts disposed at opposite ends of the first sensing electrode among the first sensor parts SP1 may have a smaller size than a first sensor part disposed at the center of the first sensing electrode. For example, the two first sensor parts may be half the size of the first sensor part disposed at the center of the first sensing electrode. In an embodiment, two second sensor parts disposed at opposite ends of the second sensing electrode among the second sensor parts SP2 may have a smaller size than a second sensor part disposed at the center of the second sensing electrode. For example, the two second sensor parts may be half the size of the second sensor part disposed at the center of the second sensor part.

Although the first sensing electrodes 1E1-1 to 1E1-5 and the second sensing electrodes 1E2-1 and 1E2-4 according to an embodiment are illustrated in FIG. 3, the shapes thereof are not limited thereto. In an embodiment of the present disclosure, the first sensing electrodes 1E1-1 to 1E1-5 and the second sensing electrodes 1E2-1 and 1E2-4 may have a shape (e.g., a bar shape) in which sensor parts and connecting parts are not distinguished from each other. In FIG. 3, the first sensor parts SP1 and the second sensor parts SP2 are illustrated as having a rhombic shape. However, without being limited thereto, the first sensor parts SP1 and the second sensor parts SP2 may have different polygonal shapes.

In one first sensing electrode, the first sensor parts SP1 are arranged along the first direction DR1, and, in one second sensing electrode, the second sensor parts SP2 are arranged along the second direction DR2. Each of the first connecting parts CP1 connects the first sensor parts SP1 adjacent to each other, and each of the second connecting parts CP2 connects the second sensor parts SP2 adjacent to each other.

The first sensing electrodes 1E1-1 to 1E1-5 and the second sensing electrodes 1E2-1 to 1E2-4 may have a mesh form. As the first sensing electrodes 1E1-1 to 1E1-5 and the second sensing electrodes 1E2-1 to 1E2-4 have the mesh form, parasitic capacitance with electrodes of the display panel DP (refer to FIG. 2) may be decreased.

The first sensing electrodes 1E1-1 to 1E1-5 and the second sensing electrodes 1E2-1 to 1E2-4 having the mesh form may contain, but are not limited to, silver, aluminum, copper, chromium, nickel, titanium, or the like, that is able to be processed at low temperature. In an embodiment, even though the input sensing layer ISP is formed by a continuous process, damage to the light emitting element 114 (refer to FIG. 10) may be prevented or substantially prevented.

Each of the first signal lines SL1-1 to SL1-5 is connected to one end of a corresponding one of the first sensing electrodes 1E1-1 to 1E1-5. In an embodiment of the present disclosure, the input sensing layer ISP may further include signal lines, each of which is connected to an opposite end of a corresponding one of the first sensing electrodes 1E1-1 to 1E1-5.

The first signal lines SL1-1 to SL1-5, the second signal lines SL2-1 to SL2-4, and the third signal lines SL2-5 to SL2-8 may be disposed in the peripheral area NAA. The pad PLD may include the input pads I-PD that extend from ends of the first signal lines SL1-1 to SL1-5, the second signal lines SL2-1 to SL2-4, and the third signal lines SL2-5 to SL2-8 and that are disposed in the peripheral area NAA.

Figure 4A:
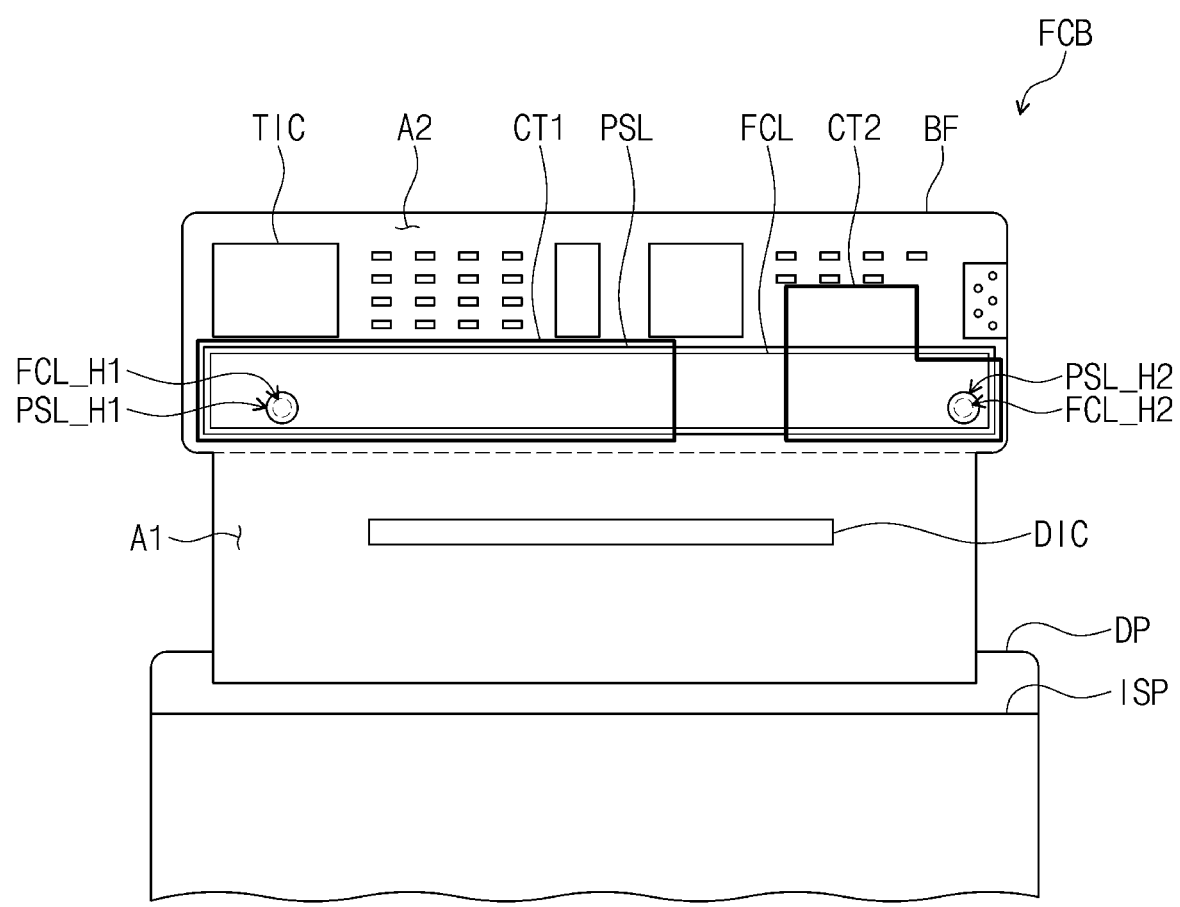
FIGS. 4A and 4B are plan views of a flexible circuit film according to an embodiment of the present disclosure.
Figure 4B:
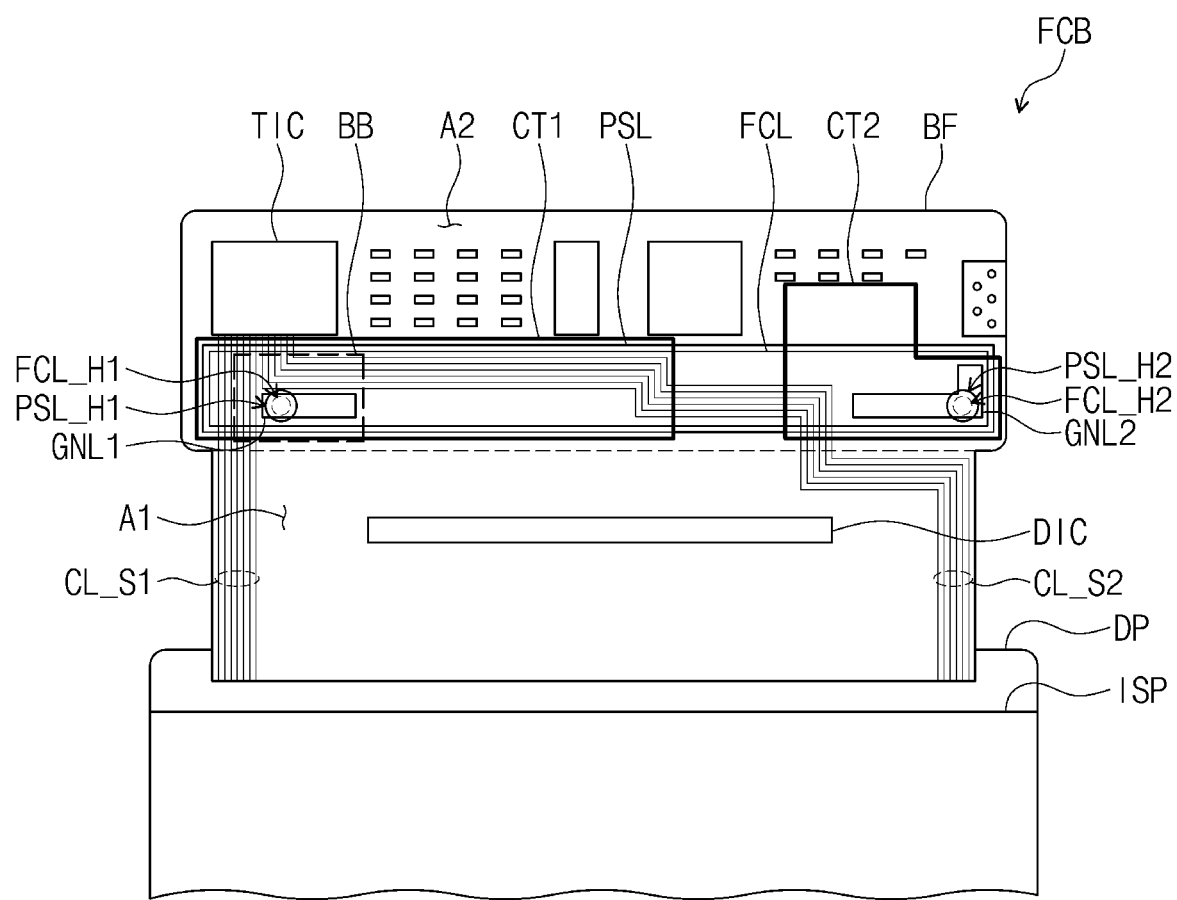

FIGS. 4A and 4B are plan views of the flexible circuit film according to an embodiment of the present disclosure.

Referring to FIGS. 2, 3, 4A, and 4B, an end portion of the flexible circuit film FCB is coupled to the display panel DP. The flexible circuit film FCB may be coupled with the pad PLD of the display panel DP. Accordingly, the flexible circuit film FCB may be electrically connected with the signal lines SGL of the display panel DP and the first to third signal lines SL1-1 to SL1-5, SL2-1 to SL2-4, and SL2-5 to SL2-8 of the input sensing layer ISP through the pad PLD.

In an embodiment of the present disclosure, the flexible circuit film FCB may be formed of a flexible material. The panel driving chip DIC may be mounted on the flexible circuit film FCB. The sensor driving chip TIC may be additionally mounted on the flexible circuit film FCB. In an embodiment, the flexible circuit film FCB may be bent such that the panel driving chip DIC is disposed on a rear surface of the display panel DP.

The flexible circuit film FCB includes a base film BF. The base film BF may include a first area A1 and a second area A2. The panel driving chip DIC is mounted on the first area A1 of the base film BF, and the sensor driving chip TIC and various drive elements are mounted on the second area A2 of the base film BF.

The flexible circuit film FCB includes panel connection wires that are disposed in the first area A1 of the base film BF and that connect the panel driving chip DIC and the pad PLD of the display panel DP. The panel connection wires are disposed between the panel driving chip DIC and the pad PLD. The flexible circuit film FCB includes sensor connection wires CL_S1 and CL_S2 that are disposed in the first and second areas A1 and A2 of the base film BF and that connect the sensor driving chip TIC and the pad PLD of the display panel DP. The sensor connection wires CL_S1 and CL_S2 include a first group CL_S1 disposed on a first side of the panel driving chip DIC and a second group CL_S2 disposed on a second side of the panel driving chip DIC. Here, the first side may be defined as the left side of the panel driving chip DIC, and the second side may be defined as the right side of the panel driving chip DIC.

The flexible circuit film FCB further includes ground wires GNL1 and GNL2 disposed on the base film BF. The ground wires GNL1 and GNL2 may be copper wires and may receive ground voltage. The ground wires GNL1 and GNL2 may be disposed on the second area A2 of the base film BF. In an embodiment of the present disclosure, the ground wires GNL1 and GNL2 may include first and second ground wires GNL1 and GNL2. However, the number of ground wires GNL1 and GNL2 is not limited thereto.

The ground wires GNL1 and GNL2 may be spaced apart from the sensor connection wires CL_S1 and CL_S2 in the second area A2. The ground wires GNL1 and GNL2 may be electrically insulated from the sensor connection wires CL_S1 and CL_S2.

The flexible circuit film FCB further includes an insulating layer PSL disposed on the sensor connection wires CL_S1 and CL_S2 and the ground wires GNL1 and GNL2. In an embodiment, the insulating layer PSL may contain an insulating ink material. In an embodiment of the present disclosure, the insulating layer PSL may have a black color. The insulating layer PSL blocks noise from the outside. Parts of the sensor connection wires CL_S1 and CL_S2 that are disposed in the second area A2 may be covered by the insulating layer PSL. The insulating layer PSL may overlap parts of the sensor connection wires CL_S1 and CL_S2 and the ground wires GNL1 and GNL2 in the second area A2. The insulating layer PSL may have holes PSL_H1 and PSL_H2 formed therein to expose the ground wires GNL1 and GNL2. The holes PSL_H1 and PSL_H2 may include a first hole PSL_H1 through which the first ground wire GNL1 is exposed and a second hole PSL_H2 through which the second ground wire GNL2 is exposed.

The flexible circuit film FCB further includes a first conductive layer FCL disposed on the insulating layer PSL. The first conductive layer FCL may contain a conductive material. In an embodiment of the present disclosure, the first conductive layer FCL may contain a metallic material. The first conductive layer FCL may overlap parts of the sensor connection wires CL_S1 and CL_S2 and the ground wires GNL1 and GNL2 in the second area A2. The first conductive layer FCL may be electrically connected with the first and second ground wires GNL1 and GNL2 that are exposed through the first and second holes PSL_H1 and PSL_H2, respectively. Accordingly, the first conductive layer FCL may receive a ground voltage from the first and second ground wires GNL1 and GNL2. The first conductive layer FCL may be grounded by being brought into contact with the first and second ground wires GNL1 and GNL2.

The first conductive layer FCL may have holes FCL_H1 and FCL_H2 formed therein to expose the ground wires GNL1 and GNL2. The holes FCL_H1 and FCL_H2 may include a third hole FCL_H1 that corresponds to the first hole PSL_H1 and through which the first ground wire GNL1 is exposed and a fourth hole FCL_H2 that corresponds to the second hole PSL_H2 and through which the second ground wire GNL2 is exposed. In an embodiment of the present disclosure, a size of the third hole FCL_H1 may be smaller than a size of the first hole PSL_H1, and a size of the fourth hole FCL_H2 may be smaller than a size of the second hole PSL_H2.

The flexible circuit film FCB further includes cover tapes CT1 and CT2 disposed on the first conductive layer FCL and electrically connected to the ground wires GNL1 and GNL2. In an embodiment of the present disclosure, the cover tapes CT1 and CT2 may include a first cover tape CT1 disposed to overlap the first ground wire GNL1 and a second cover tape CT2 disposed to overlap the second ground wire GNL2. The first cover tape CT1 may overlap parts of the sensor connection wires CL_S1 and CL_S2 and the first ground wire GNL1 in the second area A2. The second cover tape CT2 may overlap a part of the second group CL_S2 of sensor connection wires and the second ground wire GNL2 in the second area A2.

The first and second cover tapes CT1 and CT2 block noise from the outside and protect the sensor connection wires CL_S1 and CL_S2 from a risk such as an impact applied from the outside.

The first cover tape CT1 is electrically connected with the first ground wire GNL1 exposed through the first and third holes PSL_H1 and FCL_H1, and the second cover tape CT2 is electrically connected with the second ground wire GNL2 exposed through the second and fourth holes PSL_H2 and FCL_H2. Accordingly, the first cover tape CT1 is grounded by being connected with the first ground wire GNL1, and the second cover tape CT2 is grounded by being connected with the second ground wire GNL2.

Parasitic capacitance may be formed between the first and second cover tapes CT1 and CT2 and the sensor connection wires CL_S1 and CL_S2 and between the first conductive layer FCL and the sensor connection wires CL_S1 and CL_S2. However, the first conductive layer FCL and the first and second cover tapes CT1 and CT2 are stably grounded by the first and second ground wires GNL1 and GNL2. Accordingly, the parasitic capacitance between the first conductive layer FCL, the first and second cover tapes CT1 and CT2, and the sensor connection wires CL_S1 and CL_S2 may be stably maintained at a magnitude (e.g., a predetermined magnitude) without change. Thus, a ghost touch phenomenon in which a touch is recognized although a touch action does not occur may be prevented or substantially prevented.

Figure 5:
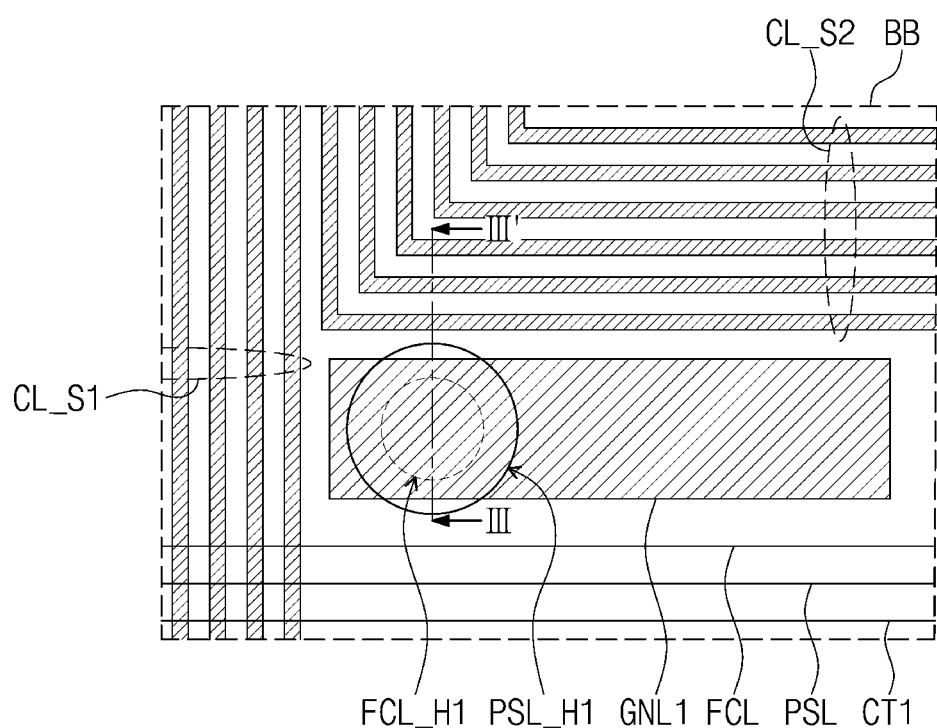
FIG. 5 is an enlarged view of a region "BB" in FIG. 4B.
Figure 6A:
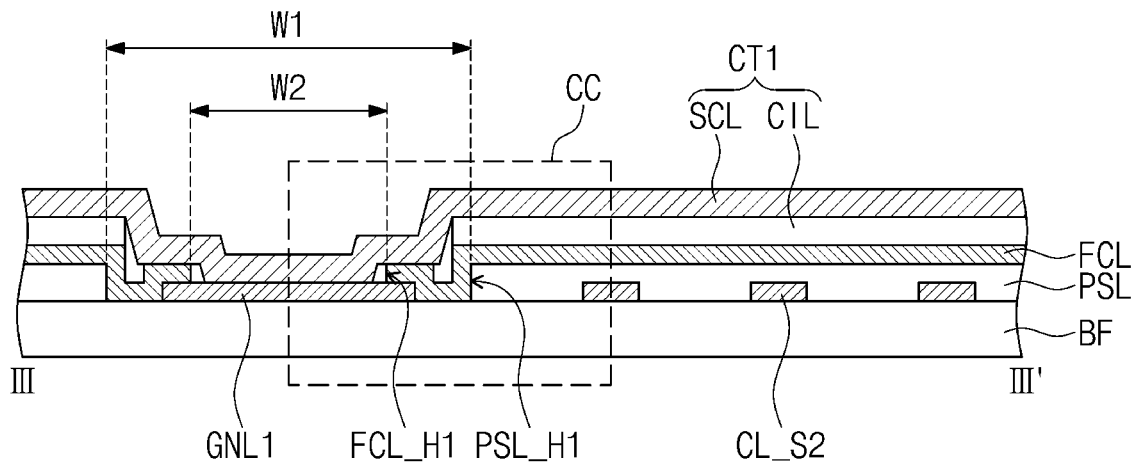
FIG. 6A is a cross-sectional view taken along the line III-III' in FIG. 5.
Figure 6B:
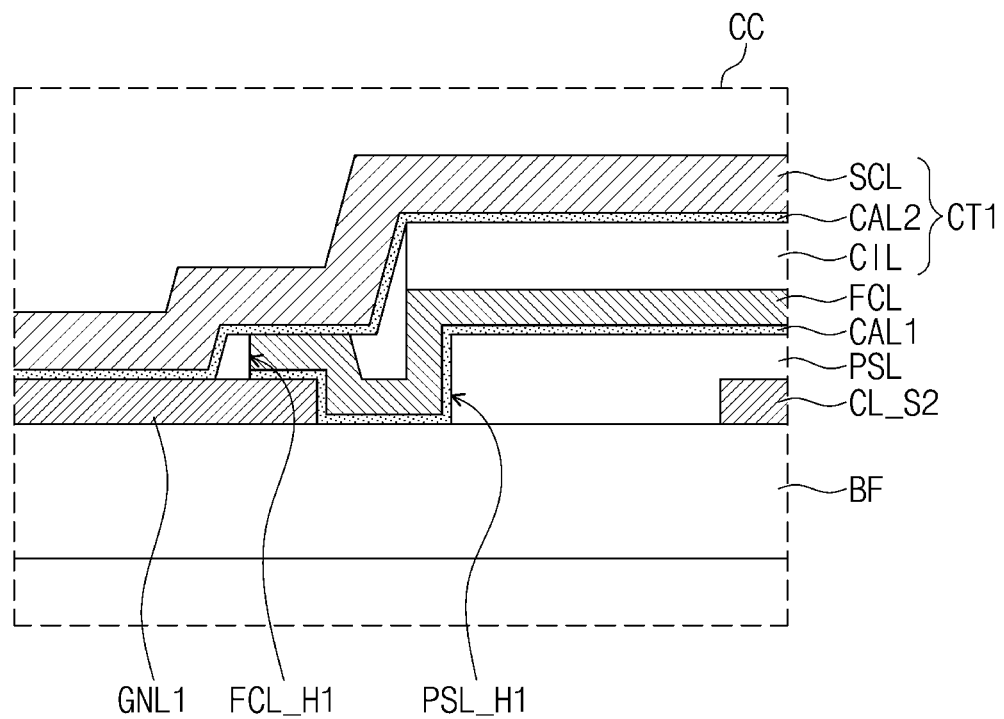
FIG. 6B is an enlarged view of a region "CC" in FIG. 6A.

FIG. 5 is an enlarged view of a region "BB" in FIG. 4B; FIG. 6A is a cross-sectional view taken along the line III-III' in FIG. 5; and FIG. 6B is an enlarged view of a region "CC" in FIG. 6A.

Referring to FIGS. 4B, 5, 6A, and 6B, the flexible circuit film FCB further includes a first conductive adhesive layer CAL1 disposed on a rear surface of the first conductive layer FCL. The first conductive adhesive layer CAL1 may contain a conductive adhesive material. In an embodiment of the present disclosure, the first conductive adhesive layer CAL1 may be a film formed by dispersing metal particles consisting of gold, silver, platinum, nickel, copper, carbon, or the like in a synthetic resin. The synthetic resin may include a material such as epoxy, silicone, polyimide, polyurethane, or the like. The first conductive adhesive layer CAL1 fixes the first conductive layer FCL to the insulating layer PSL. Further, the first conductive adhesive layer CAL1 is brought into direct contact with the first and second ground wires GNL1 and GNL2 exposed through the first and second holes PSL_H1 and PSL_H2. Accordingly, the first conductive layer FCL may be electrically connected with the first and second ground wires GNL1 and GNL2 through the first conductive adhesive layer CAL1.

In an embodiment of the present disclosure, the first hole PSL_H1 formed in the insulating layer PSL may have a first width W1. The second hole PSL_H2 formed in the insulating layer PSL may have the same width as that of the first hole PSL_H1 or a different width from that of the first hole PSL_H1. The third hole FCL_H1 formed in the first conductive layer FCL may have a second width W2. The second width W2 of the third hole FCL_H1 may be smaller than the first width W1 of the first hole PSL_H1. The first conductive layer FCL may be disposed to overlap the first ground wire GNL1 in the first hole PSL_H1. Accordingly, the first conductive layer FCL may be electrically connected with the first ground wire GNL1 by the first conductive adhesive layer CAL1 in an overlapping area between the first conductive layer FCL and the first ground wire GNL1.

Each of the first and second cover tapes CT1 and CT2 includes a cover insulating layer CIL and a second conductive layer SCL. The cover insulating layer CIL is disposed on the first conductive layer FCL, and the second conductive layer SCL is disposed on the cover insulating layer CIL. The cover insulating layer CIL may contain an adhesive insulating material. However, the present disclosure is not limited thereto. For example, each of the first and second cover tapes CT1 and CT2 may further include an adhesive layer disposed on the cover insulating layer CIL. In this case, the cover insulating layer CIL may be coupled to the first conductive layer FCL by the adhesive layer.

The second conductive layer SCL is electrically connected to the ground wires GNL1 and GNL2. The second conductive layer SCL of the first cover tape CT1 is electrically connected to the first ground wire GNL1, and the second conductive layer SCL of the second cover tape CT2 is electrically connected to the second ground wire GNL2. The second conductive layer SCL of the first cover tape CT1 overlaps the third hole FCL_H1 of the first conductive layer FCL through which the first ground wire GNL1 is exposed. The second conductive layer SCL of the second cover tape CT2 overlaps the fourth hole FCL_H2 of the first conductive layer FCL through which the second ground wire GNL2 is exposed.

Each of the first and second cover tapes CT1 and CT2 further includes a second conductive adhesive layer CAL2 disposed between the cover insulating layer CIL and the second conductive layer SCL. The second conductive adhesive layer CAL2 may contain a conductive adhesive material. The second conductive layer SCL is coupled to the cover insulating layer CIL through the second conductive adhesive layer CAL2. Further, the second conductive adhesive layer CAL2 is directly connected with the first ground wire GNL1 in the third hole FCL_H1 and is directly connected with the second ground wire GNL2 in the fourth hole FCL_H2. The second conductive layer SCL of the first cover tape CT1 is electrically connected with the first ground wire GNL1 through the second conductive adhesive layer CAL2, and the second conductive layer SCL of the second cover tape CT2 is electrically connected with the second ground wire GNL2 through the second conductive adhesive layer CAL2.

In an embodiment of the present disclosure, the first conductive adhesive layer CAL1 may have a higher adhesive strength than the second conductive adhesive layer CAL2. Accordingly, the first conductive layer FCL may be more firmly coupled to the ground wires GNL1 and GNL2 than the second conductive layer SCL. If the first and second cover tapes CT1 and CT2 are lifted in the third and fourth holes FCL_H1 and FCL_H2, the second conductive layer SCL and the ground wires GNL1 and GNL2 may fail to be electrically connected with each other. However, the first conductive layer FCL may stably remain grounded because the first conductive layer FCL is firmly coupled with the ground wires GNL1 and GNL2. Even if the first and second cover tapes CT1 and CT2 are not grounded, parasitic capacitance for each of the sensor connection wires CL_S1 and CL_S2 may be stably maintained by the first conductive layer FCL. Thus, a ghost touch phenomenon in which a touch is recognized although a touch action does not occur may be prevented or substantially prevented, thereby resulting in an improved sensing performance of the input sensing layer ISP.

Figure 7A:
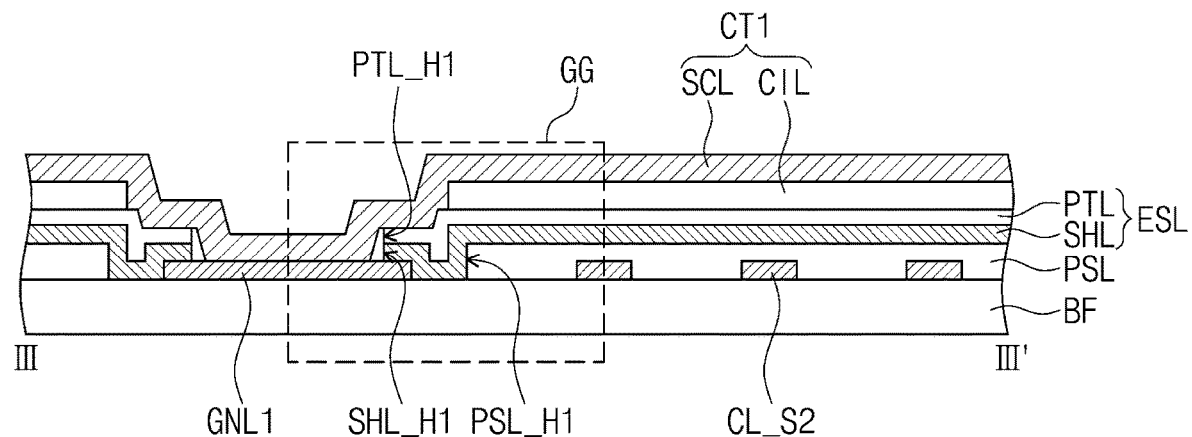
FIG. 7A is a cross-sectional view of a flexible circuit film according to an embodiment of the present disclosure, taken along a line corresponding to the line III-III'.
Figure 7B:
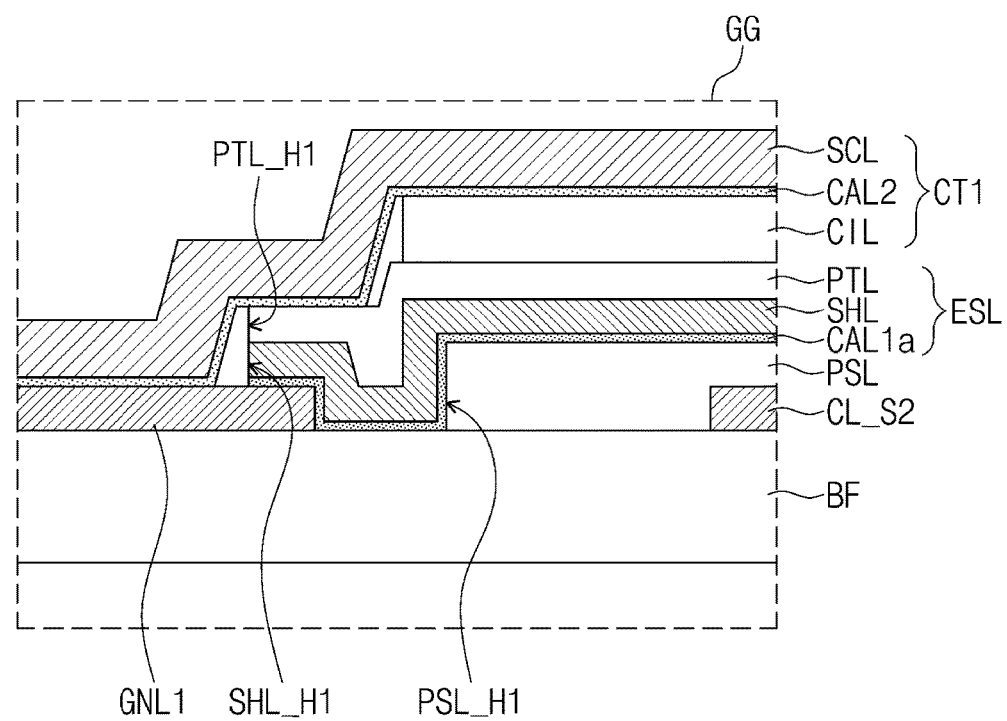
FIG. 7B is an enlarged view of a region "GG" in FIG. 7A.

FIG. 7A is a cross-sectional view of a flexible circuit film according to an embodiment of the present disclosure, taken along a line corresponding to the line III-III'; and FIG. 7B is an enlarged view of a region "GG" in FIG. 7A. Among components illustrated in FIGS. 7A and 7B, components that are the same as the components illustrated in FIGS. 6A and 6B are provided with the same reference numerals, and further descriptions thereof may be omitted.

Referring to FIGS. 4B, 5, 7A, and 7B, the flexible circuit film FCB further includes a first conductive layer ESL disposed on an insulating layer PSL. The first conductive layer ESL may include a third conductive adhesive layer CAL1a and a shielding layer SHL. The shielding layer SHL may be a layer having an electrostatic shielding function. The shielding layer SHL may contain a conductive material. In an embodiment of the present disclosure, the shielding layer SHL may contain a metallic material. The shielding layer SHL may overlap parts of sensor connection wires CL_S1 and CL_S2 and ground wires GNL1 and GNL2 in a second area A2. The shielding layer SHL may be electrically connected with the first and second ground wires GNL1 and GNL2 that are exposed through first and second holes PSL_H1 and PSL_H2, respectively. Accordingly, the shielding layer SHL may receive ground voltage from the first and second ground wires GNL1 and GNL2. The shielding layer SHL may be grounded by being brought into contact with the first and second ground wires GNL1 and GNL2.

The third conductive adhesive layer CAL1a may contain a conductive adhesive material. In an embodiment of the present disclosure, the third conductive adhesive layer CAL1a may be a film formed by dispersing metal particles consisting of gold, silver, platinum, nickel, copper, carbon, or the like in a synthetic resin. The synthetic resin may include a material such as epoxy, silicone, polyimide, polyurethane, or the like. The third conductive adhesive layer CAL1a fixes the shielding layer SHL to the insulating layer PSL. Further, the third conductive adhesive layer CAL1a is brought into direct contact with the first and second ground wires GNL1 and GNL2 exposed through the first and second holes PSL_H1 and PSL_H2. Accordingly, the shielding layer SHL may be electrically connected with the first and second ground wires GNL1 and GNL2 through the third conductive adhesive layer CAL1a.

The first conductive layer ESL may further include a protective layer PTL. The protective layer PTL may be disposed on the shielding layer SHL. The protective layer PTL may protect the shielding layer SHL from an external impact and foreign matter. The protective layer PTL may contain an insulating material.

In an embodiment of the present disclosure, the shielding layer SHL may have a hole SHL_H1 formed therein to expose the first ground wire GNL1 and a hole formed therein to expose the second ground wire GNL2. Further, the protective layer PTL may have a hole PTL_H1 formed therein to expose the first ground wire GNL1 and a hole formed therein to expose the second ground wire GNL2. The holes SHL_H1 and PTL_H1 may be provided to correspond to the first hole PSL_H1. In an embodiment of the present disclosure, sizes of the holes SHL_H1 and PTL_H1 may be smaller than a size of the first hole PSL_H1.

The flexible circuit film FCB further includes cover tapes CT1 and CT2 disposed on the first conductive layer ESL and electrically connected to the ground wires GNL1 and GNL2. In an embodiment of the present disclosure, the cover tapes CT1 and CT2 may include the first cover tape CT1 disposed to overlap the first ground wire GNL1 and the second cover tape CT2 disposed to overlap the second ground wire GNL2. The first cover tape CT1 may overlap parts of the sensor connection wires CL_S1 and CL_S2 and the first ground wire GNL1 in the second area A2. The second cover tape CT2 may overlap a part of the second group CL_S2 of sensor connection wires and the second ground wire GNL2 in the second area A2.

The first and second cover tapes CT1 and CT2 block noise from the outside and protect the sensor connection wires CL_S1 and CL_S2 from a risk such as an impact applied from the outside.

The first cover tape CT1 is electrically connected with the first ground wire GNL1 exposed through the first hole PSL_H1 formed in the insulating layer PSL and the holes SHL_H1 and PTL_H1 formed in the first conductive layer ESL. The second cover tape CT2 is electrically connected with the second ground wire GNL2 exposed through the second hole PSL_H2 formed in the insulating layer PSL and the hole formed in the first conductive layer ESL. Accordingly, the first and second cover tapes CT1 and CT2 may be grounded by being connected with the first and second ground wires GNL1 and GNL2.

Each of the first and second cover tapes CT1 and CT2 includes a cover insulating layer CIL and a second conductive layer SCL. The cover insulating layer CIL is disposed on the first conductive layer ESL, and the second conductive layer SCL is disposed on the cover insulating layer CIL.

The second conductive layer SCL is electrically connected to the ground wires GNL1 and GNL2. The second conductive layer SCL of the first cover tape CT1 is electrically connected to the first ground wire GNL1, and the second conductive layer SCL of the second cover tape CT2 is electrically connected to the second ground wire GNL2. The second conductive layer SCL of the first cover tape CT1 overlaps the holes SHL_H1 and PTL_H1 of the first conductive layer ESL through which the first ground wire GNL1 is exposed.

Each of the first and second cover tapes CT1 and CT2 further includes a second conductive adhesive layer CAL2 disposed between the cover insulating layer CIL and the second conductive layer SCL. The second conductive adhesive layer CAL2 may contain a conductive adhesive material. The second conductive layer SCL is coupled to the cover insulating layer CIL through the second conductive adhesive layer CAL2. Further, the second conductive adhesive layer CAL2 is brought into direct contact with the first ground wire GNL1 in the holes SHL_H1 and PTL_H1 of the first conductive layer ESL. That is, the second conductive layer SCL of the first cover tape CT1 is electrically connected with the first ground wire GNL1 through the second conductive adhesive layer CAL2.

In an embodiment, the third conductive adhesive layer CAL1a may have a higher adhesive strength than the second conductive adhesive layer CAL2. Accordingly, the shielding layer SHL may be more firmly coupled to the ground wires GNL1 and GNL2 than the second conductive layer SCL. If the first and second cover tapes CT1 and CT2 are lifted in the first and second holes PSL_H1 and PSL_H2, the second conductive layer SCL and the ground wires GNL1 and GNL2 may fail to be electrically connected with each other. However, the shielding layer SHL may stably remain grounded because the shielding layer SHL is firmly coupled with the ground wires GNL1 and GNL2. Even if the first and second cover tapes CT1 and CT2 are not grounded due to the lifting, parasitic capacitance for each of the sensor connection wires CL_S1 and CL_S2 may be stably maintained by the shielding layer SHL. Thus, a ghost touch phenomenon in which a touch is recognized although a touch action does not occur may be prevented or substantially prevented, thereby resulting in an improved sensing performance of the input sensing layer ISP.

Figure 8:
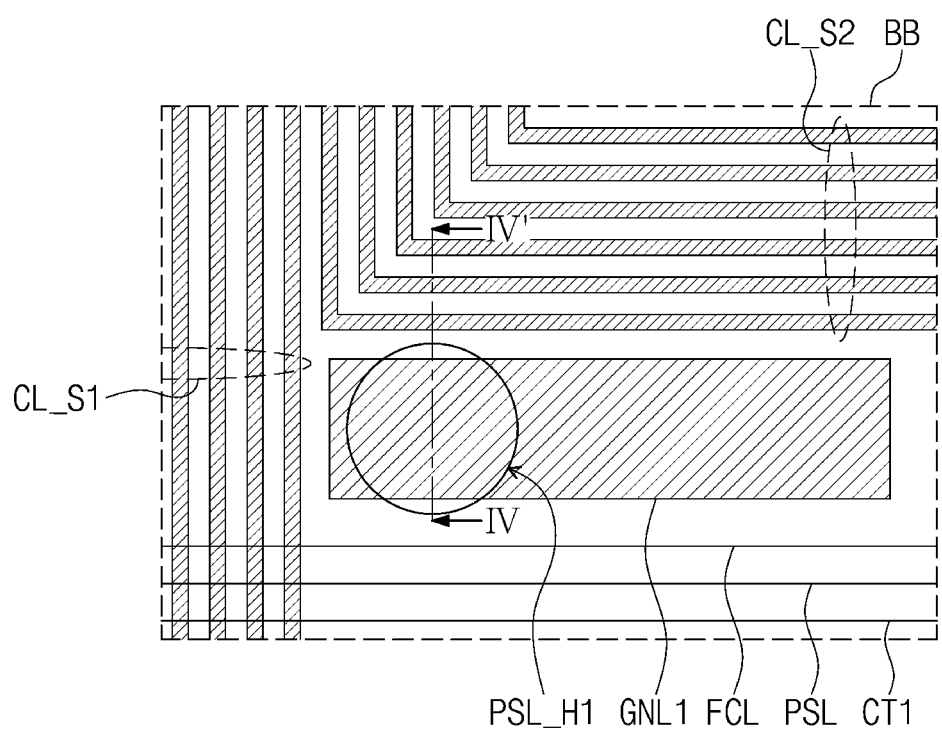
FIG. 8 is an enlarged view of a region corresponding to the region "BB" of a flexible circuit film according to an embodiment of the present disclosure.
Figure 9A:
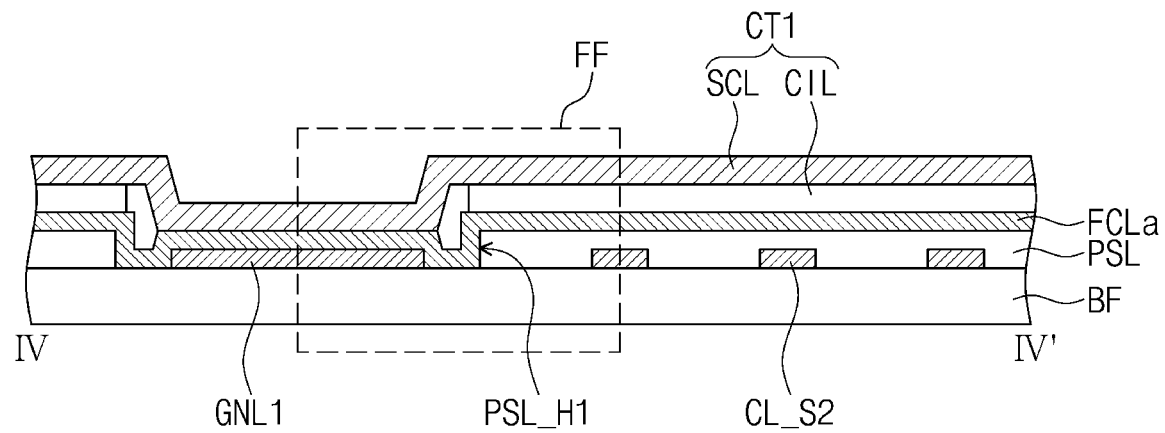
FIG. 9A is a cross-sectional view taken along the line IV-IV' in FIG. 8.
Figure 9B:
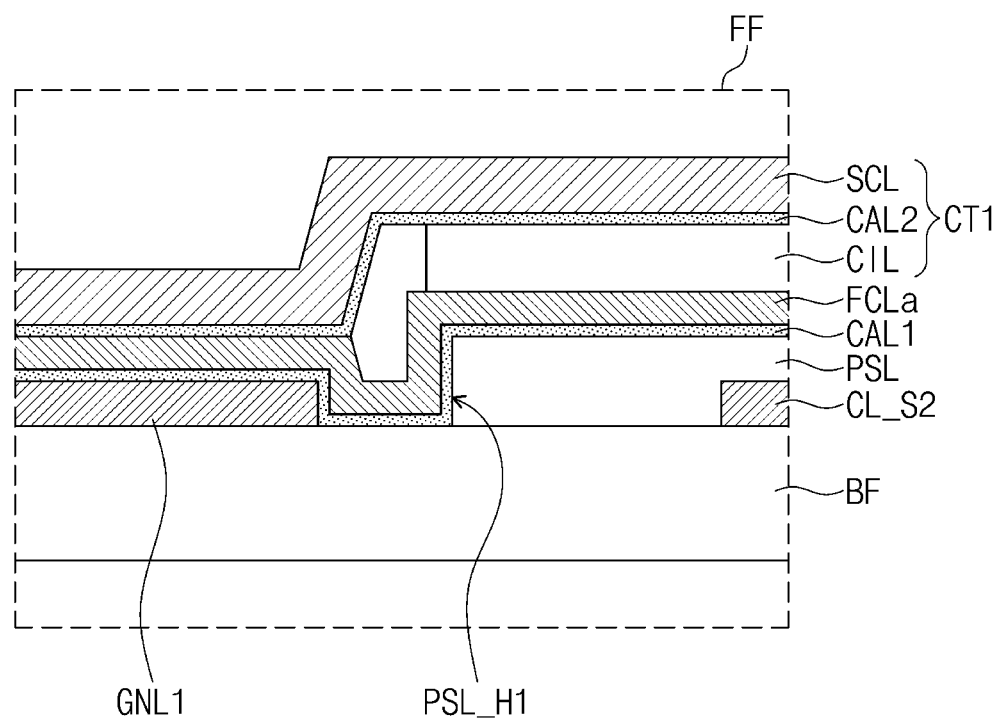
FIG. 9B is an enlarged view of a region "FF" in FIG. 9A.

FIG. 8 is an enlarged view of a region "BB" of a flexible circuit film according to an embodiment of the present disclosure; FIG. 9A is a cross-sectional view taken along the line IV-IV' in FIG. 8; and FIG. 9B is an enlarged view of a region "FF" in FIG. 9A. Among components illustrated in FIGS. 8, 9A, and 9B, components that are the same as the components illustrated in FIGS. 5, 6A, and 6B are provided with the same reference numerals, and further descriptions thereof may be omitted.

Referring to FIGS. 4B, 8, 9A, and 9B, the flexible circuit film FCB includes a base film BF, an insulating layer PSL, and a first conductive layer FCLa. The first conductive layer FCLa may overlap parts of sensor connection wires CL_S1 and CL_S2 and ground wires GNL1 and GNL2 in a second area A2. The first conductive layer FCLa may be electrically connected with the first and second ground wires GNL1 and GNL2 that are exposed through first and second holes PSL_H1 and PSL_H2, respectively. Accordingly, the first conductive layer FCLa may receive a ground voltage from the first and second ground wires GNL1 and GNL2. The first conductive layer FCLa may be grounded by being brought into contact with the first and second ground wires GNL1 and GNL2.

Unlike the first conductive layer FCL illustrated in FIGS. 5, 6A, and 6B, the first conductive layer FCLa does not have the holes FCL_H1 and FCL_H2 exposing the ground wires GNL1 and GNL2.

The flexible circuit film FCB further includes cover tapes CT1 and CT2 disposed on the first conductive layer FCLa and electrically connected to the ground wires GNL1 and GNL2. In an embodiment of the present disclosure, the cover tapes CT1 and CT2 may include the first cover tape CT1 disposed to overlap the first ground wire GNL1 and the second cover tape CT2 disposed to overlap the second ground wire GNL2. The first cover tape CT1 may overlap parts of the sensor connection wires CL_S1 and CL_S2 and the first ground wire GNL1 in the second area A2. The second cover tape CT2 may overlap a part of the second group CL_S2 of sensor connection wires and the second ground wire GNL2 in the second area A2.

The first and second cover tapes CT1 and CT2 block noise from the outside and protect the sensor connection wires CL_S1 and CL_S2 from a risk such as an impact applied from the outside.

The first cover tape CT1 is electrically connected with the first conductive layer FCLa in the area in which the first hole PSL_H1 is formed, and the second cover tape CT2 is electrically connected with the first conductive layer FCLa in the area in which the second hole PSL_H2 is formed. Accordingly, the first and second cover tapes CT1 and CT2 are grounded by being connected with the first conductive layer FCLa.

Parasitic capacitance may be formed between the first and second cover tapes CT1 and CT2 and the sensor connection wires CL_S1 and CL_S2 and between the first conductive layer FCLa and the sensor connection wires CL_S1 and CL_S2. However, the first conductive layer FCLa and the first and second cover tapes CT1 and CT2 are stably grounded by the first and second ground wires GNL1 and GNL2. Accordingly, the parasitic capacitance between the first conductive layer FCLa, the first and second cover tapes CT1 and CT2, and the sensor connection wires CL_S1 and CL_S2 may be stably maintained at a magnitude (e.g., a predetermined magnitude) without change. Thus, a ghost touch phenomenon in which a touch is recognized although a touch action does not occur may be prevented or substantially prevented.

The flexible circuit film FCB further includes a first conductive adhesive layer CAL1 disposed on a rear surface of the first conductive layer FCLa. The first conductive adhesive layer CAL1 may contain a conductive adhesive material. The first conductive adhesive layer CAL1 fixes the first conductive layer FCLa to the insulating layer PSL. Further, the first conductive adhesive layer CAL1 is brought into direct contact with the first and second ground wires GNL1 and GNL2 exposed through the first and second holes PSL_H1 and PSL_H2. Accordingly, the first conductive layer FCLa may be electrically connected with the first and second ground wires GNL1 and GNL2 through the first conductive adhesive layer CAL1.

Each of the first and second cover tapes CT1 and CT2 includes a cover insulating layer CIL and a second conductive layer SCL. The cover insulating layer CIL is disposed on the first conductive layer FCLa, and the second conductive layer SCL is disposed on the cover insulating layer CIL and is electrically connected to the first conductive layer FCLa.

Each of the first and second cover tapes CT1 and CT2 further includes a second conductive adhesive layer CAL2 disposed between the cover insulating layer CIL and the second conductive layer SCL. The second conductive adhesive layer CAL2 may contain a conductive adhesive material. The second conductive layer SCL is coupled to the cover insulating layer CIL through the second conductive adhesive layer CAL2. Further, the second conductive adhesive layer CAL2 is directly connected with the first conductive layer FCLa in the first hole PSL_H1 and is directly connected with the first conductive layer FCLa in the second hole PSL_H2. The second conductive layer SCL of the first cover tape CT1 is electrically connected with the first conductive layer FCLa through the second conductive adhesive layer CAL2, and the second conductive layer SCL of the second cover tape CT2 is electrically connected with the first conductive layer FCLa through the second conductive adhesive layer CAL2.

In an embodiment of the present disclosure, the first conductive adhesive layer CAL1 may have a higher adhesive strength than the second conductive adhesive layer CAL2. Accordingly, the first conductive layer FCLa may be more firmly coupled to the ground wires GNL1 and GNL2 than the second conductive layer SCL. If the first and second cover tapes CT1 and CT2 are lifted in the first and second holes PSL_H1 and PSL_H2, the second conductive layer SCL and the first conductive layer FCLa may fail to be electrically connected with each other. However, the first conductive layer FCLa may stably remain grounded because the first conductive layer FCLa is firmly coupled with the ground wires GNL1 and GNL2. Even if the first and second cover tapes CT1 and CT2 are not grounded, parasitic capacitance for each of the sensor connection wires CL_S1 and CL_S2 may be stably maintained by the first conductive layer FCLa. Thus, a ghost touch phenomenon in which a touch is recognized although a touch action does not occur may be prevented or substantially prevented, thereby resulting in an improved sensing performance of the input sensing layer ISP.

Figure 10:
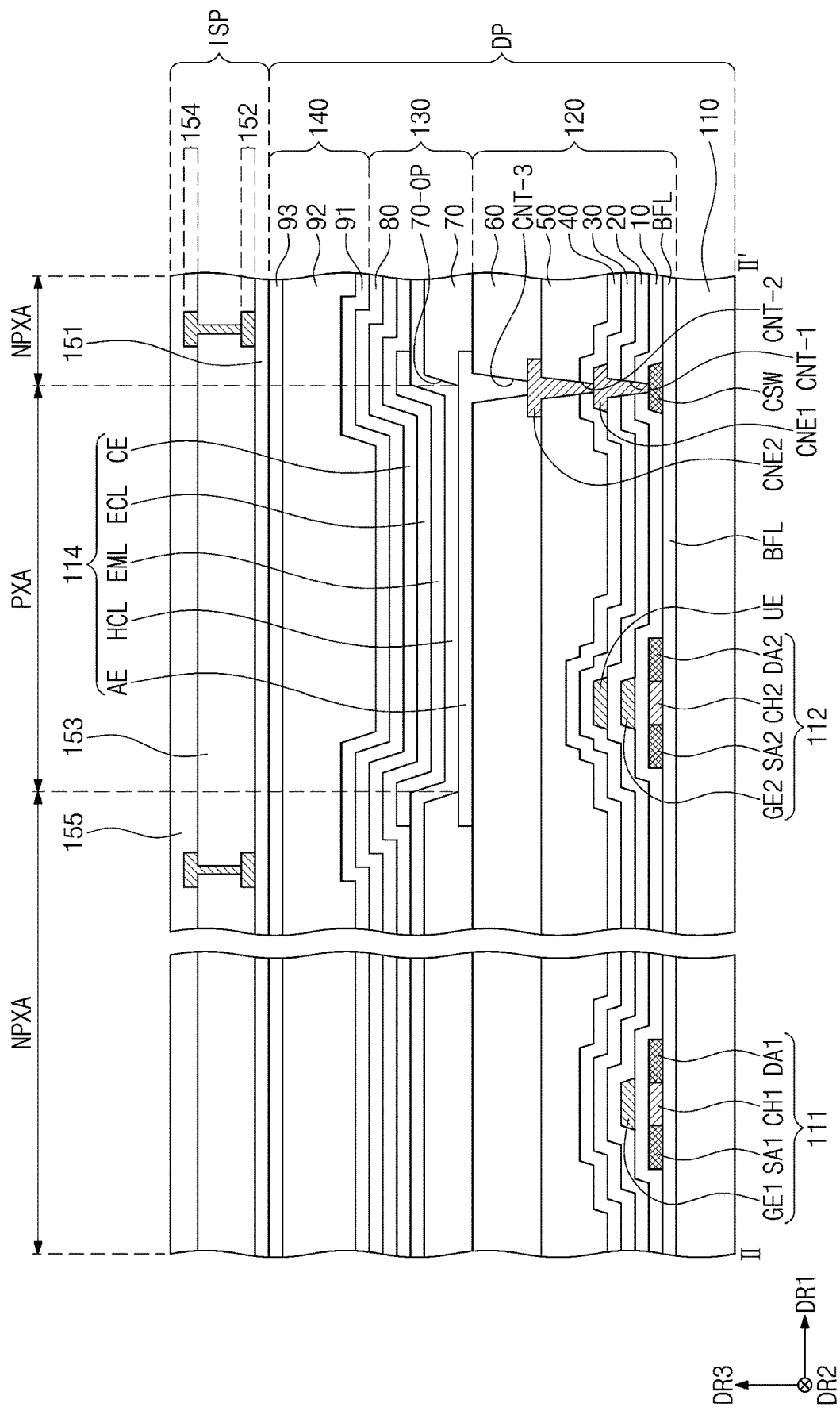
FIG. 10 is a cross-sectional view of the display panel and the input sensing layer taken along the line II-II' in FIG. 1B.

FIG. 10 is a cross-sectional view of the display panel and the input sensing layer taken along the line II-II' in FIG. 1B.

Referring to FIG. 10, the display panel DP may include a plurality of insulating layers, semiconductor patterns, conductive patterns, signal lines, and the like. An insulating layer, a semiconductor layer, and a conductive layer are formed by coating, deposition, or the like. Thereafter, in an embodiment, the insulating layer, the semiconductor layer, and the conductive layer may be selectively subjected to patterning by photolithography. The semiconductor patterns, the conductive patterns, the signal lines, and the like that are included in the circuit element layer 120 and a display element layer 130 are formed on a base layer 110 by the above-described method. Thereafter, an encapsulation layer 140 for covering the display element layer 130 may be formed.

In an embodiment, the base layer 110 may include a synthetic resin film. The synthetic resin layer may contain a thermosetting resin. In an embodiment, the base layer 110 may have a multi-layer structure. For example, the base layer 110 may have a three-layer structure including a synthetic resin layer, an adhesive layer, and a synthetic resin layer. In an embodiment, the synthetic resin layers may be polyimide-based resin layers, but the material thereof is not limited thereto. The synthetic resin layers may contain at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. In addition, the base layer 110 may include a glass substrate, an organic/inorganic composite substrate, or the like.

At least one inorganic layer is formed on an upper surface of the base layer 110. The inorganic layer may contain at least one of aluminum oxide, titanium oxide, silicon oxide, silicon oxynitride, zirconium oxide, and hafnium oxide. In an embodiment, the inorganic layer may be formed in multiple layers. The multiple inorganic layers may constitute a barrier layer and/or a buffer layer. In an embodiment, the display panel DP is illustrated as including a buffer layer BFL.

The buffer layer BFL improves a bonding force between the base layer 110 and the semiconductor patterns. In an embodiment, the buffer layer BFL may include a silicon oxide layer and a silicon nitride layer. The silicon oxide layer and the silicon nitride layer may be alternately stacked.

The semiconductor patterns are disposed on the buffer layer BFL. The semiconductor patterns may contain polysilicon. However, without being limited thereto, the semiconductor patterns may contain amorphous silicon or oxide semiconductor.

As illustrated in FIG. 10, a first semiconductor pattern of a first transistor 111 and a second semiconductor pattern of a second transistor 112 are disposed on the buffer layer BFL. The first semiconductor pattern includes a first source SA1, a first channel CH1, and a first drain DA1, and the second semiconductor pattern includes a second source SA2, a second channel CH2, and a second drain DA2. The first channel CH1 is disposed between the first source SA1 and the first drain DA1, and the second channel CH2 is disposed between the second source SA2 and the second drain DA2. In FIG. 10, part of a connection signal line CSW is illustrated. Although not separately illustrated, the connection signal line CSW may be connected to the drain DA2 of the second transistor 112 on a plane.

A first insulating layer 10 is disposed on the buffer layer BFL. The first insulating layer 10 covers a plurality of semiconductor patterns. The first insulating layer 10 may be an inorganic layer and/or an organic layer and may have a single layer structure or a multi-layer structure. In an embodiment, the first insulating layer 10 may contain at least one of aluminum oxide, titanium oxide, silicon oxide, silicon oxynitride, zirconium oxide, and hafnium oxide. In an embodiment, the first insulating layer 10 may be a single layer of silicon oxide. Not only the first insulating layer 10 but also insulating layers of the circuit element layer 120, which will be described below, may be inorganic layers and/or organic layers and may have a single layer structure or a multi-layer structure. The inorganic layers may contain at least one of the aforementioned materials.

A first gate GE1 of the first transistor 111 and a second gate GE2 of the second transistor 112 are disposed on the first insulating layer 10. The first and second gates GE1 and GE2 overlap the first and second channels CH1 and CH2, respectively.

A second insulating layer 20 may be disposed on the first insulating layer 10 and may cover the first and second gates GE1 and GE2. The second insulating layer 20 may be an inorganic layer and/or an organic layer and may have a single layer structure or a multi-layer structure. In an embodiment, the second insulating layer 20 may be a single layer of silicon oxide.

An upper electrode UE may be disposed on the second insulating layer 20. The upper electrode UE may overlap the second gate GE2 of the second transistor 112. Part of the second gate GE2 and the upper electrode UE overlapping the second gate GE2 may form a capacitor.

A third insulating layer 30 may be disposed on the second insulating layer 20 and may cover the upper electrode UE. In an embodiment, the third insulating layer 30 may be a single layer of silicon oxide. A first connecting electrode CNE1 may be disposed on the third insulating layer 30. The first connecting electrode CNE1 may be connected to the connection signal line CSW through a first contact hole CNT-1 formed through the first, second, and third insulating layers 10, 20, and 30.

A fourth insulating layer 40 may be disposed on the third insulating layer 30. In an embodiment, the fourth insulating layer 40 may be a single layer of silicon oxide. A fifth insulating layer 50 may be disposed on the fourth insulating layer 40. In an embodiment, the fifth insulating layer 50 may be an organic layer. A second connecting electrode CNE2 may be disposed on the fifth insulating layer 50. The second connecting electrode CNE2 may be connected to the first connecting electrode CNE1 through a second contact hole CNT-2 formed through the fourth insulating layer 40 and the fifth insulating layer 50.

A sixth insulating layer 60 may be disposed on the fifth insulating layer 50 and may cover the second connecting electrode CNE2. In an embodiment, the sixth insulating layer 60 may be an organic layer. A first electrode AE is disposed on the sixth insulating layer 60. The first electrode AE is connected to the second connecting electrode CNE2 through a third contact hole CNT-3 formed through the sixth insulating layer 60. An opening 70-OP is defined in a pixel defining film 70. At least part of the first electrode AE is exposed through the opening 70-OP of the pixel defining film 70.

The active area AA (refer to FIG. 1B) may include emissive areas PXA and a non-emissive area NPXA adjacent to the emissive areas PXA. The non-emissive area NPXA may surround the emissive areas PXA. In an embodiment, each of the emissive areas PXA is defined to correspond to a partial area of the first electrode AE exposed through the opening 70-OP.

In an embodiment, a hole control layer HCL may be commonly disposed in the emissive areas PXA and the non-emissive area NPXA. The hole control layer HCL may include a hole transporting layer and may further include a hole injection layer. An emissive layer EML may be disposed on the hole control layer HCL. The emissive layer EML may be disposed in an area corresponding to the opening 70-OP. In an embodiment, the emissive layer EML may be separately formed in each of the emissive areas PXA.

In an embodiment, an electron control layer ECL may be disposed on the emissive layer EML. The electron control layer ECL may include an electron transporting layer and may further include an electron injection layer. In an embodiment, the hole control layer HCL and the electron control layer ECL may be commonly formed in the emissive areas PXA by using an open mask. A second electrode CE may be disposed on the electron control layer ECL. In an embodiment, the second electrode CE has an integrated shape and is commonly disposed in the emissive areas PXA.

A capping layer 80 may be disposed on the second electrode CE and may be brought into contact with the second electrode CE. In an embodiment, the capping layer 80 may contain an organic material. The capping layer 80 may protect the second electrode CE from a subsequent process, for example, a sputtering process and may improve the light emission efficiency of the light emitting element 114. In an embodiment, the capping layer 80 may have a higher refractive index than a first inorganic layer 91 that will be described below. However, the capping layer 80 may be omitted.

The encapsulation layer 140 may be disposed on the display element layer 130. In an embodiment, the encapsulation layer 140 may include the first inorganic layer 91, an organic layer 92, and a second inorganic layer 93. The first inorganic layer 91 and the second inorganic layer 93 protect the display element layer 130 from moisture/oxygen, and the organic layer 92 protects the display element layer 130 from foreign matter such as dust particles. The first inorganic layer 91 and the second inorganic layer 93 may be any of a silicon nitride layer, a silicon oxynitride layer, and a silicon oxide layer. In an embodiment of the present disclosure, the first inorganic layer 91 and the second inorganic layer 93 may include a titanium oxide layer, an aluminum oxide layer, or the like. The organic layer 92 may include, but is not limited to, an acrylate-based organic layer.

The input sensing layer ISP may include a base insulating layer 151, a first sensing conductive layer 152, a first sensing insulation layer 153, a second sensing conductive layer 154, and a second sensing insulation layer 155. In an embodiment, the input sensing layer ISP may be formed by a continuous process after the display panel DP is formed. However, the present disclosure is not limited thereto.

In an embodiment, the base insulating layer 151 may be directly disposed on the display panel DP. For example, the base insulating layer 151 may be brought into direct contact with the second inorganic layer 93. The base insulating layer 151 may have a single layer structure or a multi-layer structure. However, the base insulating layer 151 may be omitted. In another embodiment, the base insulating layer 151 may be formed on a separate base layer, and the base layer may be coupled with the display panel DP through an adhesive member.

Each of the first sensing conductive layer 152 and the second sensing conductive layer 154 may have a single layer structure, or may have a multi-layer structure stacked along the third direction DR3. The conductive layer having the single layer structure may include a metal layer or a transparent conductive layer. The metal layer may contain molybdenum, silver, titanium, copper, aluminum, or an alloy thereof. In an embodiment, the transparent conductive layer may contain transparent conductive oxide such as indium tin oxide (ITO), indium zinc oxide (IZO), zinc oxide (ZnO), indium zinc tin oxide (IZTO), or the like. In addition, the transparent conductive layer may contain a conductive polymer such as PEDOT, a metal nano wire, graphene, or the like.

The conductive layer having the multi-layer structure may include a plurality of metal layers. The metal layers may have, for example, a three-layer structure of titanium/aluminum/titanium. The conductive layer having the multi-layer structure may include at least one metal layer and at least one transparent conductive layer.

Each of the first sensing conductive layer 152 and the second sensing conductive layer 154 may include patterns constituting sensing electrodes. The input sensing layer ISP may obtain information about an external input through a change in mutual capacitance between the sensing electrodes.

The first sensing insulation layer 153 may be disposed between the first sensing conductive layer 152 and the second sensing conductive layer 154 and may cover the first sensing conductive layer 152. Part of the second sensing conductive layer 154 may be electrically connected with part of the first sensing conductive layer 152 through a contact hole formed through the first sensing insulation layer 153. The second sensing insulation layer 155 may be disposed on the first sensing insulation layer 153 and may cover the second sensing conductive layer 154.

In an embodiment, at least one of the first sensing insulation layer 153 and the second sensing insulation layer 155 may include an inorganic film. The inorganic film may contain at least one of aluminum oxide, titanium oxide, silicon oxide, silicon oxynitride, zirconium oxide, and hafnium oxide.

In an embodiment, at least one of the first sensing insulation layer 153 and the second sensing insulation layer 155 may include an organic film. The organic film may contain at least one of an acrylate-based resin, a methacrylate-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

As described above, the first conductive layer and the cover tape disposed on the flexible circuit film are stably grounded by the ground wire. Accordingly, parasitic capacitance between the first conductive layer, the cover tape, and the sensor connection wires may be stably maintained at a magnitude (e.g., a predetermined magnitude) without change. Thus, a ghost touch phenomenon in which a touch is recognized although a touch action does not occur may be prevented or substantially prevented, which results in an improvement in the sensing reliability of the display device.

While the present disclosure has been described with reference to some embodiments thereof, it will be apparent to those of ordinary skill in the art that various changes and modifications may be made thereto without departing from the spirit and scope of the present disclosure as set forth in the following claims.

What is claimed is:

1. A display device comprising:
   a display module comprising a display panel and an input sensing layer on the display panel; and
   a flexible circuit film connected to the display module, wherein the flexible circuit film comprises:
   a base film;
   a sensor connection wire on the base film and electrically connected to the input sensing layer;
   a ground wire on the base film;
   an insulating layer on the sensor connection wire and the ground wire;
   a first conductive layer on the insulating layer and electrically connected to the ground wire; and
   a cover tape on the first conductive layer and electrically connected to the ground wire.

2. The display device of claim 1, wherein the cover tape comprises:
   a cover insulating layer on the first conductive layer; and
   a second conductive layer on the cover insulating layer, and
   wherein the second conductive layer is electrically connected to the ground wire.

3. The display device of claim 2, wherein the insulating layer has a first hole formed therein to expose the ground wire, and
   wherein the first conductive layer overlaps the ground wire in the first hole.

4. The display device of claim 3, wherein the first conductive layer has a third hole formed therein to expose the ground wire, the third hole overlapping the first hole, and
   wherein the second conductive layer is connected with the ground wire through the third hole.

5. The display device of claim 4, wherein the third hole has a smaller size than the first hole.

6. The display device of claim 3, wherein the second conductive layer overlaps the first conductive layer in the first hole and is connected with the first conductive layer.

7. The display device of claim 3, wherein the flexible circuit film further comprises a first conductive adhesive layer between the first conductive layer and the ground wire, and
   wherein the cover tape further comprises a second conductive adhesive layer between the second conductive layer and the ground wire.

8. The display device of claim 7, wherein the first conductive adhesive layer has a higher adhesive strength than the second conductive adhesive layer.

9. The display device of claim 1, wherein the first conductive layer comprises:

a third conductive adhesive layer on the insulating layer; and a shielding layer on the third conductive adhesive layer.

10. The display device of claim 9, wherein the shielding layer comprises a conductive material.

11. The display device of claim 9, wherein the first conductive layer further comprises a protective layer on the shielding layer.

12. The display device of claim 1, further comprising:
a sensor controller on the flexible circuit film and electrically connected with the input sensing layer through the sensor connection wire; and
a panel driver on the flexible circuit film and electrically connected to the display panel.

13. The display device of claim 1, wherein the display panel comprises:
a base layer;
a display element layer comprising a light emitting element disposed on the base layer; and
an encapsulation layer covering the display element layer.

14. The display device of claim 13, wherein the input sensing layer is directly on the encapsulation layer.

15. The display device of claim 1, wherein the input sensing layer comprises:
a first sensing electrode;
a second sensing electrode insulated from the first sensing electrode to form a mutual capacitance;
a first signal line connected to the first sensing electrode; and
a second signal line connected to the second sensing electrode.

16. The display device of claim 15, wherein the sensor connection wire is electrically connected to the first and second signal lines, and
wherein the sensor connection wire partially overlaps the cover tape and the first conductive layer on a plane.

17. A display device comprising:
a display module comprising a display panel and an input sensing layer on the display panel; and
a flexible circuit film connected to the display module, wherein the flexible circuit film comprises:
a base film;
a sensor connection wire on the base film and connected to the input sensing layer;
a ground wire on the base film;
an insulating layer on the sensor connection wire and the ground wire;
a first conductive layer on the insulating layer and coupled to the ground wire with a first adhesive strength; and
a cover tape on the first conductive layer and coupled to the ground wire with a second adhesive strength different from the first adhesive strength.

18. The display device of claim 17, wherein the first adhesive strength is greater than the second adhesive strength.

19. The display device of claim 18, wherein the cover tape comprises:
a cover insulating layer on the first conductive layer; and
a second conductive layer on the cover insulating layer, and
wherein the second conductive layer is electrically connected to the ground wire.

20. The display device of claim 19, wherein the flexible circuit film further comprises a first conductive adhesive layer between the first conductive layer and the ground wire,
wherein the cover tape further comprises a second conductive adhesive layer between the second conductive layer and the ground wire, and
wherein the first conductive adhesive layer has a higher adhesive strength than the second conductive adhesive layer.

* * * * *